(12) United States Patent
Duppong et al.

(10) Patent No.: US 7,848,116 B2
(45) Date of Patent: Dec. 7, 2010

(54) CIRCUIT BOARD CARRIER FOR CIRCUIT BOARD ARRANGEMENT IN A WORK MACHINE

(75) Inventors: Jeffrey Scott Duppong, Fargo, ND (US); Dale Arthur Janssen, Fargo, ND (US); Amanda Renee Wyland, Glyndon, MN (US); Richard James Livdahl, West Fargo, ND (US); Vincent Guy Segal, Fargo, ND (US); Travis Lee Johnston, Fargo, ND (US); Nathan Matthew Hawk, Fargo, ND (US)

(73) Assignee: Deere & Company, Moline, IL (US)

( * ) Notice: Subject to any disclaimer, the term of this patent is extended or adjusted under 35 U.S.C. 154(b) by 857 days.

(21) Appl. No.: 11/541,927

(22) Filed: Oct. 2, 2006

(65) Prior Publication Data
US 2008/0080157 A1   Apr. 3, 2008

(51) Int. Cl.
*H05K 7/12* (2006.01)
(52) U.S. Cl. .................. 361/801; 361/759; 361/807; 439/327; 439/329
(58) Field of Classification Search ............... 361/801, 361/759, 807, 809; 439/327, 326, 329
See application file for complete search history.

(56) References Cited

U.S. PATENT DOCUMENTS

| | | | | |
|---|---|---|---|---|
| 3,829,741 A | * | 8/1974 | Athey ........................ | 361/756 |
| 3,932,016 A | * | 1/1976 | Ammenheuser ............ | 439/377 |
| 5,642,263 A | * | 6/1997 | Laruhn ...................... | 361/801 |
| 5,726,865 A | * | 3/1998 | Webb et al. ................ | 361/801 |
| 5,902,143 A | * | 5/1999 | Pan et al. ................... | 439/327 |
| 6,056,574 A | * | 5/2000 | Yeomans et al. ........... | 439/327 |
| 6,064,574 A | * | 5/2000 | Yu et al. .................... | 361/704 |

(Continued)

FOREIGN PATENT DOCUMENTS

DE         2516746         10/1976

(Continued)

OTHER PUBLICATIONS

Vertical Mount Card Guide. Catalog [online]. Richco Inc., [retrieved on Oct. 2, 2006] Internet: <URL: http://www.richco-inc.com/group_details.asp?seccode=100&grpcode=005>.

(Continued)

*Primary Examiner*—Dameon E Levi

(57) ABSTRACT

A circuit board arrangement includes a first printed circuit board having a first edge connector, and a second printed circuit board having a second edge connector and a plurality of holes positioned in relation to the second edge connector. A pair of circuit board carriers mount the first printed circuit board generally perpendicular to the second printed circuit board. Each circuit board carrier is positioned at an opposite lateral edge of the first printed circuit board. Each circuit board carrier includes a flat base for abutting the second circuit board, and a pair of wings on laterally opposite sides of the base. Each wing includes a snap-in feature for snap engagement with a corresponding hole in the second circuit board. At least one slot guide retains a corresponding lateral edge of the first printed circuit board. A retainer at an end generally opposite the base retains a distal edge of the first printed circuit board.

26 Claims, 3 Drawing Sheets

U.S. PATENT DOCUMENTS

| | | | |
|---|---|---|---|
| 6,083,026 A * | 7/2000 | Trout et al. | 439/328 |
| 6,095,822 A * | 8/2000 | Corisis et al. | 439/65 |
| 6,160,706 A * | 12/2000 | Davis et al. | 361/704 |
| 6,219,251 B1 * | 4/2001 | Wang | 361/752 |
| 6,310,779 B1 * | 10/2001 | Wang | 361/760 |
| 6,320,750 B2 | 11/2001 | Shaler et al. | |
| 6,891,729 B2 | 5/2005 | Ko et al. | |
| 7,641,495 B1 * | 1/2010 | Sun | 439/327 |
| 2005/0009396 A1 | 1/2005 | Wu | |

FOREIGN PATENT DOCUMENTS

DE 3422768 1/1986

OTHER PUBLICATIONS

Circuit Board Guide. Catalog [online]. Richco Inc., [retrieved on Oct. 2, 2006] Internet: <URL: http://www.richco-inc.com/group_details.asp?seccode=100&grpcode=010>.

* cited by examiner

CIRCUIT BOARD CARRIER FOR CIRCUIT BOARD ARRANGEMENT IN A WORK MACHINE

FIELD OF THE INVENTION

The present invention relates to printed circuit board arrangements for use in work machines, and, more particularly, to circuit board guides used to hold one circuit board in relation to another circuit board.

BACKGROUND OF THE INVENTION

Work machines such as agricultural tractors, combines, construction and forestry equipment continually rely to a greater extent upon electronics and electronic controls. Work machines may operate in extreme environments compared to other applications. Among other concerns, it is necessary for on-board electronics to be designed from an electronics packaging standpoint with vibration, heat transfer and electromagnetic interference (EMI) in mind. Thus, electronics for work machines must be generally of a robust design.

A common method of mounting a daughterboard to a motherboard is using a commercially available plastic circuit board guide, such as available from RichCo (see http://www.richco-inc.com). Referring to FIG. 1, these circuit board guides snap through slots in the motherboard and project up from the surface of the motherboard. The daughterboard slides down in grooves formed on the edges of the circuit board guides. Small wings near the base of the guide, seen more clearly in FIG. 2, extend out and make contact with the motherboard to provide some stability (limits side-to-side movement). Flaps on the bottom of the base act like a harpoon head, first pushing through the mother board and then snapping out to prevent inadvertent removal.

Another type of commercially available circuit board guide referred to as a vertical mount card guide is more rigid in that is made of metal and mounts by screwing tightly into the motherboard. A number of screws pass through holes in the motherboard and screw into the base of the vertical mount card guide.

Commercially available circuit board guides as described above include certain inherent problems. For example, with a circuit board guide as described above, there is a certain amount of "float" of the circuit board in the tracks of the guide. This float can be back and forth in the track or up and down (away from and toward the motherboard).

Moreover, known circuit board guides do not guarantee a high degree of perpendicularity between the daughterboard and motherboard. Although a vertical mount card guide may do a better job of guaranteeing perpendicularity by requiring screws to mount the guides to the motherboard, the screws add cost to the unit, both in material cost for the screws, and in labor to attach the screws to the board. Further, circuit board guides available off-the-shelf today are designed for taller circuit boards and computer cards. The typical application of these guides is to fit various circuit boards into a predefined volume of space, such as the casing for a personal computer, and perpendicularity is not necessarily required. Few if any are available for a short profile board which must be rigidly perpendicular to the motherboard.

The electrical connection at the interface between the daughterboard and motherboard can be of various known types, such as with a plug-in edge connector, soldered pins, soldered pads, etc. For example, to complete the electrical connection between the daughterboard and motherboard, solder may be applied between metal pads on one board and similar pads on the second board. The end of the daughterboard is placed such that the pads carried thereby are in close proximity to the pads on the motherboard. Solder "bridging" is when solder flows between two adjacent pads and causes an electrical short circuit. It is not easy to control the placement of solder to form the joint between the two boards. Because the placement of solder is difficult, and because the daughterboard is placed at a 90-degree angle to the motherboard (minimizing surface contact), the solder joints can be weak. If the circuit card guides allow even a small amount of side to side movement, the solder joint can break (causing an open circuit or intermittent contact).

What is needed in the art is a circuit board arrangement in which perpendicularity and electrical contact between the daughterboard and motherboard is ensured, and relative movement between the daughterboard and motherboard is minimized.

SUMMARY OF THE INVENTION

The invention comprises, in one form thereof, a circuit board carrier for mounting a first printed circuit board in relation to a second printed circuit board. The circuit board carrier includes a flat base for abutting the second circuit board. A pair of wings on laterally opposite sides of the base each include a snap-in feature for snap engagement with a corresponding hole in the second circuit board. At least one slot guide retains a lateral edge of the first printed circuit board. A retainer at an end generally opposite the base retains a distal edge of the first printed circuit board.

The invention comprises, in another form thereof, a circuit board arrangement including a first printed circuit board having a first edge connector, and a second printed circuit board having a second edge connector and a plurality of holes positioned in relation to the second edge connector. A pair of circuit board carriers mount the first printed circuit board generally perpendicular to the second printed circuit board. Each circuit board carrier is positioned at an opposite lateral edge of the first printed circuit board. Each circuit board carrier includes a flat base for abutting the second circuit board, and a pair of wings on laterally opposite sides of the base. Each wing includes a snap-in feature for snap engagement with a corresponding hole in the second circuit board. At least one slot guide retains a corresponding lateral edge of the first printed circuit board. A retainer at an end generally opposite the base retains a distal edge of the first printed circuit board.

DETAILED DESCRIPTION OF THE INVENTION

Figure 1:
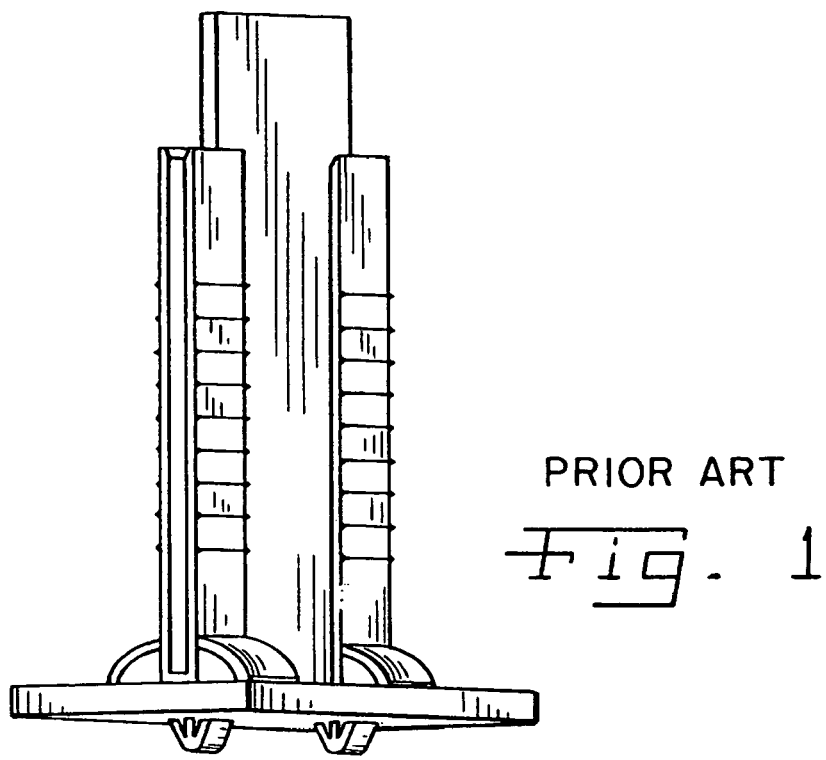
FIG. 1 is a perspective view of a known circuit board guide for interconnecting a daughterboard with a motherboard.
Figure 2:
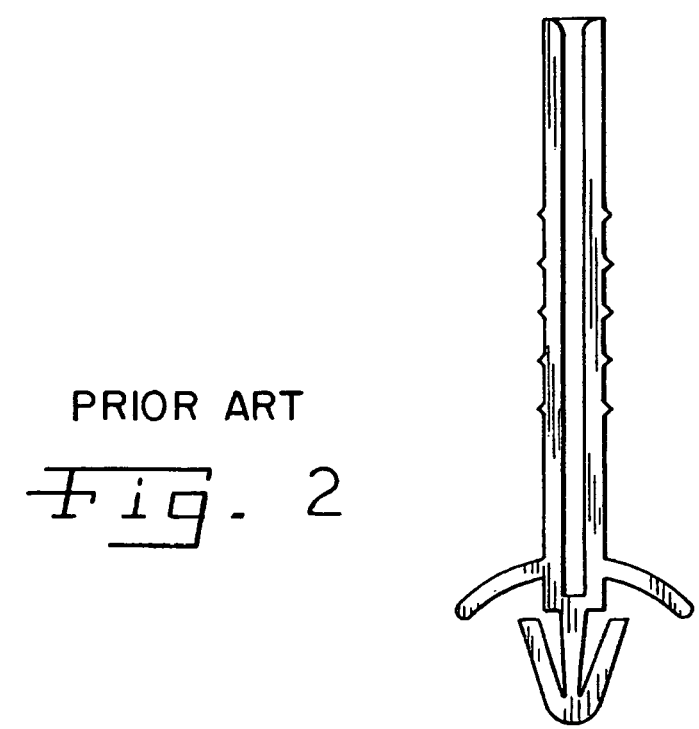
FIG. 2 is a side view of the circuit board guide shown in FIG. 1.
Figure 3:
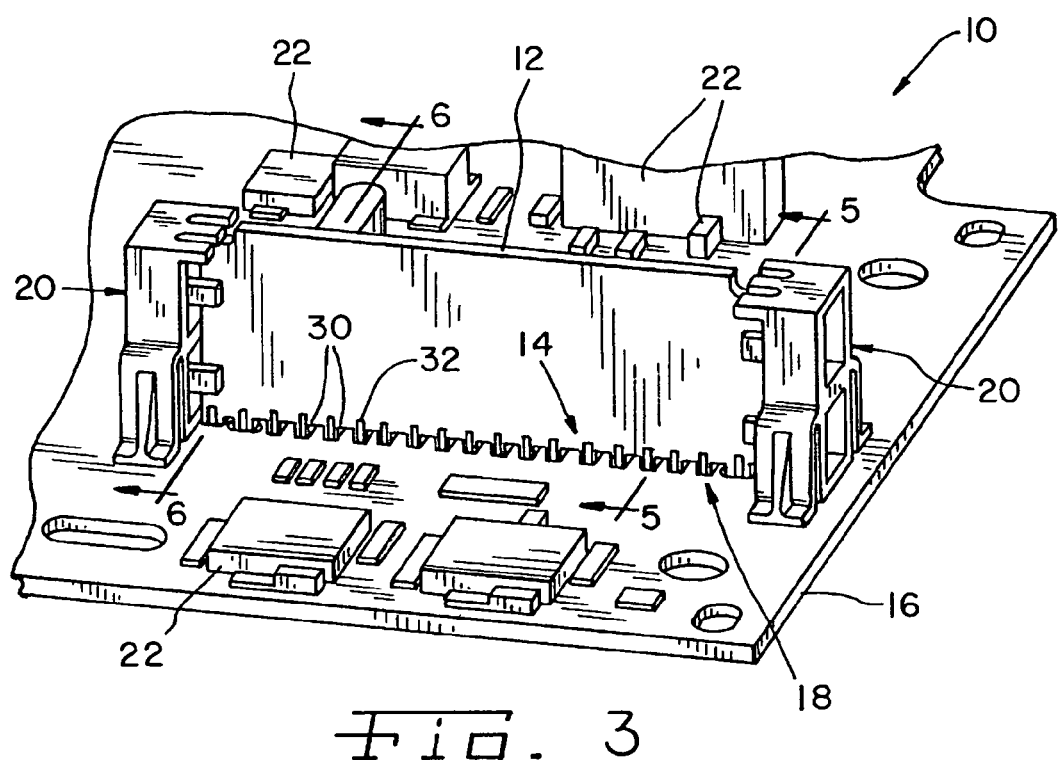
FIG. 3 is a perspective, fragmentary view of an embodiment of a circuit board arrangement of the present invention.
Figure 6:
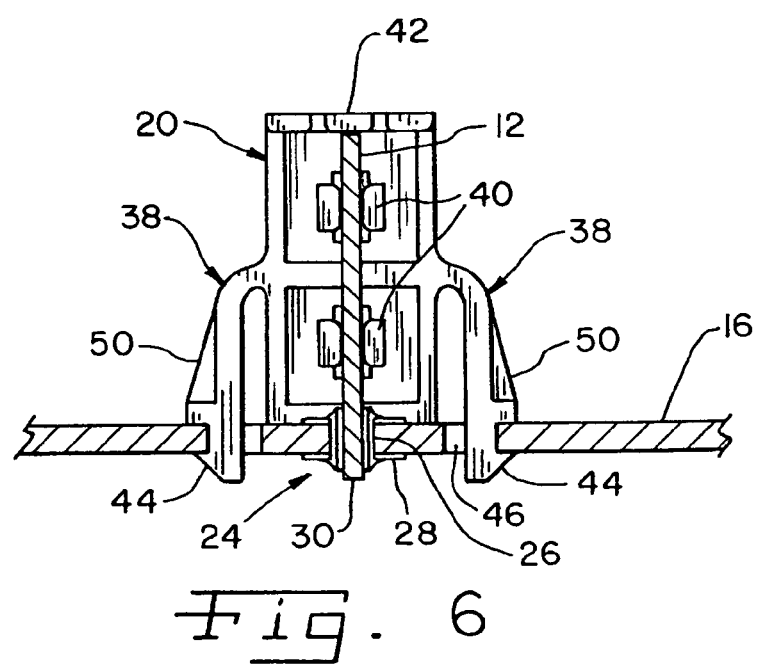
FIG. 6 is a sectional view taken along line 6-6 in FIG. 3.

Referring now to the drawings, and more particularly to FIG. 3, there is shown an embodiment of a a circuit board arrangement 10 of the present invention, which generally includes a first printed circuit board (PCB) 12 with a first edge connector 14, a second PCB 16 with a second edge connector 18, a pair of circuit board carriers 20, and other miscellaneous electrical components 22. In the embodiment shown, first PCB 12 is in the form of a daughterboard and second PCB 16 is in the form of a motherboard. However, it is to be understood that circuit board arrangement 10 can be any type of arrangement in which a smaller PCB is electrically and mechanically mounted to a larger PCB.

Figure 5:
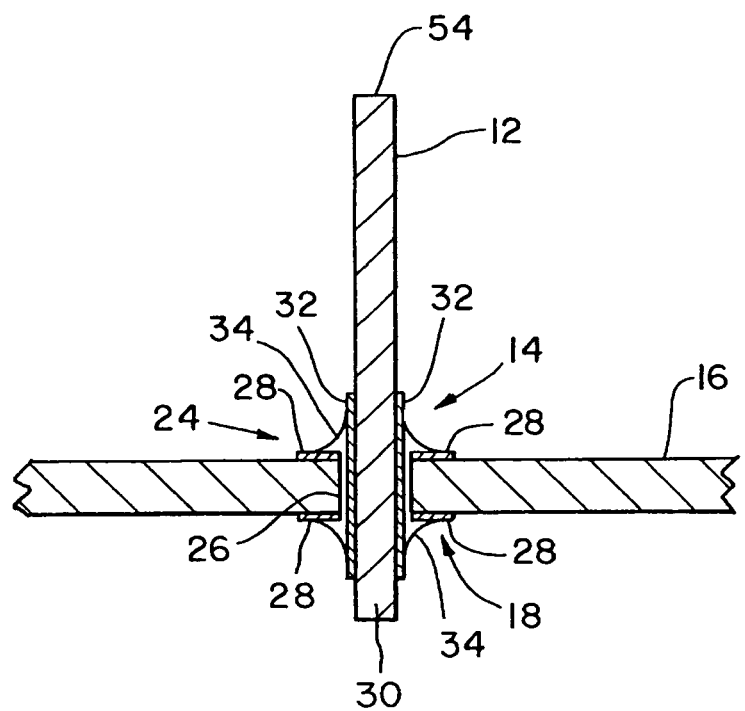
FIG. 5 is a sectional, fragmentary view of an embodiment of a soldered edge connector taken along line 5-5 in FIG. 3.

First edge connector 14 and second edge connector 18 together define a card edge connector 24 (FIGS. 3 and 5). In the embodiment shown, first edge connector 14 and second edge connector 18 together define a metallurgically bonded card edge connector 24. More particularly, second edge connector 18 of second PCB 16 includes a plurality of rectangular shaped openings 26 arranged generally in line with each other. Four conductor pads 28, a pair on each side of second PCB 16, are positioned adjacent opposite lateral side edges of each respective opening 26. Each conductor pad 28 is electrically coupled with a corresponding trace in second PCB 16. First edge connector 14 of first PCB 12 includes a plurality of fingers 30 which are respectively received within a corresponding opening 26 in second PCB 16. A pair of conductor pads 32 are positioned on opposite lateral sides of each respective finger 30. Each pair of conductor pads 32 is electrically coupled with a corresponding trace in first PCB 12, and has a length extending past a corresponding opening 26 on opposite sides of second PCB 16 so as to define a target location for metallurgically bonding a pair of conductor pads 28 with an adjacent pair of conductor pads 32. The metallurgic bonding is carried out using a soldering operation, such as a wave soldering operation, that bonds the conductor pads 32 of a given finger 30 with the adjacent conductor pads 28, without bridging the solder between conductor pads 32 of adjacent fingers 30. Such bridging is undesirable and may cause electrical shorting. The wave soldering process results in liquid solder 34 flowing through openings 26 and adhering to both sides of the solder joint as shown in FIG. 5.

A soldered edge connector as described above provides a strong electrical joint that inhibits float between first PCB 12 and second PCB 16. The four (or quadruple) solder joints defined at the inside corners of each finger 30 and second PCB 16 substantially eliminate possible breakage that could occur with weaker joints, and also provide improved heat transfer from first PCB 12 to second PCB 16, or vice versa depending upon the heat generated by the respective electrical components.

Although first PCB 12 and second PCB 16 are shown and described as being electrically coupled together using a soldered edge connector, it is to be understood that other types of card edge connectors may be used. For example, a card edge connector in the form of a plug-in card edge connector may be used with the circuit board arrangement 10 of the present invention.

Figure 4:
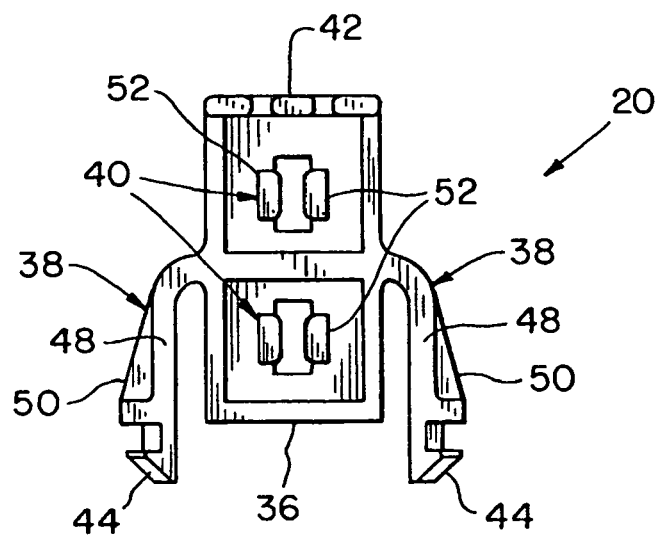
FIG. 4 is a plan view of an embodiment of a circuit board carrier used with the circuit board arrangement shown in FIG. 3.

Referring now to FIGS. 3 and 4, circuit board carriers 20 will be described in greater detail. Each circuit board carrier 20 is configured substantially the same, and thus only a single circuit board carrier 20 will be described in detail herein. Each circuit board carrier 20 generally includes a flat base 36, pair of wings 38, at least one slot guide 40 and a retainer 42.

Flat base 36 abuts second PCB 16 and provides a wide, stable base to prevent tipping of first PCB 12 relative to second PCB 16. Wings 38 are positioned on laterally opposite sides of base 36. The distal end of each wing 38 includes a snap-in feature 44 which snap engages with a corresponding hole 46 formed in second PCB 16. In the embodiment shown, each snap-in feature 44 is in the form of a harpoon snap feature and each hole 46 is configured as a substantially round hole; however, snap-in feature 44 and hole 46 can be differently configured depending upon the application.

In the embodiment shown, each wing 38 is a generally L-shaped wing including a leg 48, and a stiffening flange 50 extending between leg 48 and snap-in feature 44. Coupling the distal ends of wings 38 with second PCB 16 outside the outboard ends of wide, flat base 36 provides a stable mounting between first PCB 12 and second PCB 16 with a perpendicularity of between +/−2 degrees, preferably with a perpendicularity of between +/−1 degree.

Each circuit board carrier 20 includes a pair of slot guides 40, with each slot guide 40 including a pair of projections 52 spaced apart to receive without substantial clearance a lateral side edge of first PCB 12 therebetween. Of course, it will be appreciated that circuit board carrier 20 can be configured with a single slot guide 40 or more than two slot guides 40, depending upon the application.

Retainer 42 is positioned at and end of circuit board carrier 20 generally opposite from wide, flat base 36. Retainer 42 functions to retain a distal edge 54 of first PCB 12 (opposite first edge connector 14) and prevent float of first PCB 12 in directions toward and away from second PCB 16. In the embodiment shown, retainer 42 is in the form of a retainer lip which lies over and retains a notch 56 at distal edge 54 of first PCB 12. The retainer lip may be a segmented retainer lip, such as shown in the drawings, which can deflect slightly to apply a biasing force against distal edge 54, depending upon the length of and corresponding clearance with first PCB 12.

With a conventional circuit board guide as described above, the guide is installed into the motherboard and the daughterboard is slid into the guide until the edge connectors of the daughterboard and motherboard are mated together. With the circuit board carrier 20 of the present invention, first edge connector 14 of first PCB 12 is mated with second edge connector 18 of second PCB 16. A circuit board carrier 20 is then positioned such that slot guides 40 receive a lateral side edge of first PCB 12 therebetween and snap-in features 44 lie adjacent a respective hole 46. Circuit board carrier 20 is then pushed so that the lip on the harpoon snap feature 44 snaps into the back side of hole 46. At the same time the harpoon snap feature 44 locks into place within hole 46, retainer lip 42 seats against or closely adjacent to distal edge 54 of first PCB 12. Circuit board carriers 20 are made from a heat resistant material, such as glass-filled nylon, so that conductor pads 28 and 32 can be soldered together using a wave soldering process as described above.

In the event that a soldered edged connector is used between first PCB 12 and second PCB 16, then it will be appreciated that it is not intended to remove first PCB 12 from second PCB 16. However, if a different type of edge connector is used (such as a plug-in edge connector), then to remove first PCB 12, circuit board carriers 20 are detached from second PCB 16 by disengaging harpoon snap features 44 from holes 46. First PCB 12 is then pulled away from second PCB 16 to disengage the edge connector.

Having described the preferred embodiment, it will become apparent that various modifications can be made without departing from the scope of the invention as defined in the accompanying claims.

The invention claimed is:

1. A circuit board carrier for mounting a first printed circuit board in relation to a second circuit board, said circuit board carrier comprising:

a flat base for abutting said second circuit board, said second circuit board having a second edge connector;

a pair of wing supports on laterally opposite sides of said base, each said wing support terminating in a snap-in feature for interlocking engagement with a corresponding hole in said second circuit board such that the snap-in feature contacts two opposite sides of said second circuit board and such that the snap-in feature is spaced apart from the flat base;

at least one slot guide for retaining a lateral edge of said first printed circuit board, the first printed circuit board comprising a first edge connector; and a retainer at an end generally opposite said base for retaining a distal edge of said first printed circuit board, the distal edge opposite the first edge connector, the first edge connector comprising a plurality of fingers with first conductor pads for electrical connection and bonding to corresponding second conductor pads associated with the second circuit board.

2. The circuit board carrier of claim 1, wherein each said snap-in feature comprises a harpoon snap feature.

3. The circuit board carrier of claim 1, wherein said at least one slot guide comprises a plurality of slot guides.

4. The circuit board carrier of claim 1, wherein said retainer comprises a retainer lip.

5. The circuit board carrier of claim 4, wherein said retainer lip comprises a segmented retainer lip.

6. The circuit board carrier of claim 1, wherein each said wing support comprises a generally L-shaped wing.

7. The circuit board carrier of claim 6, wherein each said wing support includes a stiffening flange extending between a leg and said snap-in feature.

8. The circuit board carrier of claim 1, wherein said circuit board carrier provides a mounting between said first circuit board and said second circuit board with a perpendicularity of between +/−2 degrees.

9. The circuit board carrier of claim 8, wherein said circuit board carrier provides a mounting between said first circuit board and said second circuit board with a perpendicularity of between +/−1 degree.

10. The circuit board carrier of claim 1, wherein said first printed circuit board is a daughterboard and said second circuit board is a motherboard.

11. A circuit board arrangement, comprising:

a first printed circuit board including a first edge connector;

a second printed circuit board including a second edge connector and a plurality of holes positioned in relation to said second edge connector; and a pair of circuit board carriers mounting said first printed circuit board generally perpendicular to said second printed circuit board, each said circuit board carrier positioned at an opposite lateral edge of said first printed circuit board, each said circuit board carrier including:

a flat base for abutting said second circuit board;

a pair of wing supports on laterally opposite sides of said base, each said wing support terminating in a snap-in feature for interlocking engagement with a corresponding said hole in said second circuit board such that the snap-in feature contacts two opposite sides of said second circuit board and such that the snap-in feature is spaced apart from the flat base;

at least one slot guide for retaining a corresponding said lateral edge of said first printed circuit board; and a retainer at an end generally opposite said base for retaining a distal edge of said first printed circuit board, the distal edge opposite the first edge connector, the first edge connector comprising a plurality of fingers with first conductor pads electrically connected and bonded with solder to corresponding second conductor pads associated with the second printed circuit board.

12. The circuit board arrangement of claim 11, wherein each said snap-in feature comprises a harpoon snap feature.

13. The circuit board arrangement of claim 11, wherein said at least one slot guide comprises a plurality of slot guides.

14. The circuit board arrangement of claim 11, wherein said retainer comprises a retainer lip.

15. The circuit board arrangement of claim 14, wherein said retainer lip comprises a segmented retainer lip.

16. The circuit board arrangement of claim 11, wherein each said wing comprises a generally L-shaped wing.

17. The circuit board arrangement of claim 16, wherein each said wing includes a stiffening flange extending between a leg and said snap-in feature.

18. The circuit board arrangement of claim 11, wherein said circuit board carrier provides a mounting between said first circuit board and said second circuit board with a perpendicularity of between +/−2 degrees.

19. The circuit board arrangement of claim 18, wherein said circuit board carrier provides a mounting between said first circuit board and said second circuit board with a perpendicularity of between +/−1 degree.

20. The circuit board arrangement of claim 11, wherein said first printed circuit board is a daughterboard and said second printed circuit board is a motherboard.

21. The circuit board arrangement of claim 11, wherein said first edge connector and said second edge connector each comprise a soldered edge connector.

22. A circuit board carrier for mounting a first printed circuit board in relation to a second circuit board, said circuit board carrier comprising:

a flat base for abutting said second circuit board, the second circuit board having a second edge connector;

a pair of wing supports on laterally opposite sides of said base, each said wing support terminating in a snap-in feature for interlocking engagement with a corresponding hole in said second circuit board such that the snap-in feature contacts two opposite sides of said second circuit board and such that the snap-in feature is spaced apart from the flat base; and at least one slot guide for retaining a lateral edge of said first printed circuit board, the first circuit board comprising a first edge connector, the first edge connector comprising a plurality of fingers with first conductor pads for electrical connection and bonding to corresponding second conductor pads associated with the second circuit board.

23. The circuit board carrier of claim 22, wherein each said snap-in feature comprises a harpoon snap feature.

24. The circuit board carrier of claim 22, wherein said at least one slot guide comprises a plurality of slot guides.

25. The circuit board carrier of claim 22, wherein each said wing support comprises a generally L-shaped wing.

26. The circuit board carrier of claim 25, wherein each said wing support includes a stiffening flange extending between a leg and said snap-in feature.

* * * * *